(12) United States Patent
Pan (10) Patent No.: US 8,633,635 B1
(45) Date of Patent: Jan. 21, 2014

(54) MICROELECTROMECHANICAL RESONATORS WITH THERMALLY-ACTUATED FREQUENCY TUNING BEAMS

(75) Inventor: Wanling Pan, San Jose, CA (US)

(73) Assignee: Integrated Device Technology Inc., San Jose, CA (US)

( * ) Notice: Subject to any disclaimer, the term of this patent is extended or adjusted under 35 U.S.C. 154(b) by 372 days.

(21) Appl. No.: 13/174,082

(22) Filed: Jun. 30, 2011

(51) Int. Cl.
*H03H 3/04* (2006.01)

(52) U.S. Cl.
USPC ........... 310/346; 310/306; 310/309; 310/370; 333/189

(58) Field of Classification Search
USPC ........... 310/346, 370, 367, 306, 309; 333/189
See application file for complete search history.

(56) References Cited

U.S. PATENT DOCUMENTS

| | | | |
|---|---|---|---|
| 7,514,853 B1 | 4/2009 | Howe et al. | |
| 7,639,105 B2 | 12/2009 | Ayazi et al. | |
| 7,800,282 B2 | 9/2010 | Ayazi et al. | |
| 7,843,284 B2 | 11/2010 | Ayazi et al. | |
| 7,888,843 B2 | 2/2011 | Ayazi et al. | |
| 7,924,119 B1 * | 4/2011 | Ayazi et al. | 333/186 |
| 7,939,990 B2 | 5/2011 | Wang et al. | |
| 8,061,013 B2 | 11/2011 | Ayazi et al. | |
| 2002/0074897 A1 * | 6/2002 | Ma et al. | 310/311 |
| 2005/0242904 A1 * | 11/2005 | Lutz et al. | 333/200 |
| 2006/0033594 A1 * | 2/2006 | Lutz et al. | 333/186 |
| 2006/0261703 A1 * | 11/2006 | Quevy et al. | 310/315 |
| 2009/0108959 A1 * | 4/2009 | Piazza et al. | 333/189 |
| 2010/0060111 A1 * | 3/2010 | Ayazi et al. | 310/367 |
| 2010/0127596 A1 | 5/2010 | Ayazi et al. | |
| 2010/0127798 A1 | 5/2010 | Ayazi et al. | |
| 2011/0074247 A1 | 3/2011 | Hohlfeld et al. | |

OTHER PUBLICATIONS

Courcimault et al., "High-Q Mechanical Tuning of MEMS Resonators Using a Metal Deposition—Annealing Technique," The 13th International Conference on Solid-State Sensors, Actuators and Microsystems, Seoul, Korea, Jun. 5-9, 2005, pp. 875-878.
Hsu et al., "In Situ Localized Annealing for Contamination Resistance and Enhanced Stability in Nickel Micromechanical Resonators," 10th International Conference on Solid-State Sensors and Actuators, Sendai, Japan, Jun. 7-10, 1999, pp. 932-935.
Hsu et al., "Frequency Trimming for MEMS Resonator Oscillators." Discera Inc., Ann Arbor, Michigan whsu@discera.com (2007).
International Preliminary Report on Patentability Corresponding to International Application No. PCT/US2009/065489; Date of Mailing: Jun. 9, 2011; 10 pages.
Invitation to Pay Additional Fees, International Application No. PCT/US2009/065489, Jun. 2, 2010.

(Continued)

*Primary Examiner* — Derek Rosenau
*Assistant Examiner* — Bryan Gordon
(74) *Attorney, Agent, or Firm* — Myers Bigel, et al.

(57) ABSTRACT

A microelectromechanical resonator includes a resonator body anchored to a substrate by at least a pair of tethers that suspend the resonator body opposite an underlying opening in the substrate. A first thermally-actuated tuning beam is provided, which is mechanically coupled to a first portion of the resonator body that is spaced apart from the pair of tethers. The first thermally-actuated tuning beam is configured to induce a mechanical stress in the resonator body by establishing a thermal expansion difference between the first thermally-actuated tuning beam and the resonator body in response to a passing of current through the first thermally-actuated tuning beam.

22 Claims, 5 Drawing Sheets

(56) References Cited

OTHER PUBLICATIONS

Krause et al., "Determination of aluminum diffusion parameters in silicon," Journal of Applied Physics, vol. 91, No. 9, May 1, 2002, pp. 5645-5649.

Notification of Transmittal of the International Search Report and the Written Opinion of the International Searching Authority, or the Declaration, PCT/US2009/065489, Jul. 12, 2010.

Pourkamali et al., "Low-Impedance VHF and UHF Capacitive Silicon Bulk Acoustic Wave Resonators—Part I: Concept and Fabrication," IEEE Transactions on Electron Devices 54:2017-2023 (2007).

Samarao et al., "Post-Fabrication Electrical Trimming of Silicon Bulk Acoustic Resonators Using Joule Heating," $22^{nd}$ IEEE International Conference on Micro Electro Mechanical Systems MEMS 2009, Sorrento, Italy. Jan. 25-29, 2009.

Sundaresan et al., "Electronically Temperature Compensated Silicon Bulk Acoustic Resonator Reference Oscillators," IEEE Journal of Solid-State Circuits 42:1425-1434. (2007).

* cited by examiner

Fig. 4B dimensional variations,"; and in U.S. Pat. No.

MICROELECTROMECHANICAL RESONATORS WITH THERMALLY-ACTUATED FREQUENCY TUNING BEAMS

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f·Q products. Accordingly, MEMs resonators are considered a desirable alternative to quartz resonators in real-time and other clock applications.

Figure 1:
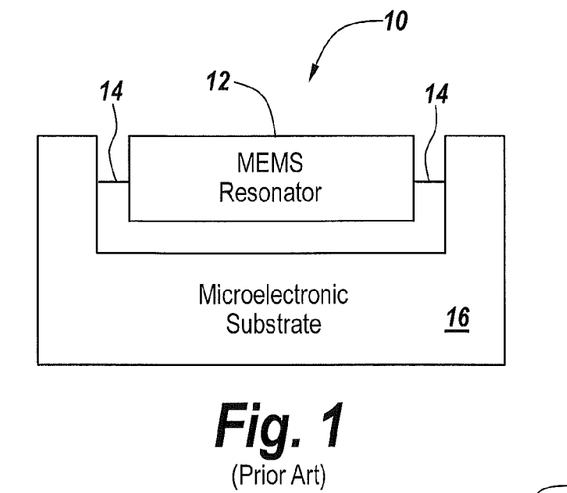
FIG. 1 is a cross-sectional schematic of a conventional microelectromechanical resonator.

One example of a MEMs resonator includes lateral-mode piezoelectric resonators, such as thin-film piezoelectric-on-silicon (TPoS) resonators, which have been successfully incorporated into low-power and low-noise oscillators. FIG. 1 illustrates a conventional MEMs resonator 10 containing a resonator body 12 that is suspended opposite a recess in a substrate 16 by a pair of opposing tethers 14. This resonator body 12 may include a stack of multiple layers, including a semiconductor body, a bottom electrode on the semiconductor body, a piezoelectric layer on the bottom electrode and a plurality of top electrodes on the piezoelectric layer. The recess may be formed by selectively removing portions of a buried insulating layer within a semiconductor-on-insulator (SIO) substrate 16 containing a semiconductor device layer thereon. Other examples of these types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference. Unfortunately, frequency tuning has not been studied extensively in these types of resonators.

Active frequency tuning techniques that include application of a DC voltage on the piezoelectric layer have been demonstrated, but such tuning typically requires relatively large voltages, which may be incompatible with the low operating voltages of conventional oscillator circuits. Some examples of active frequency tuning in micromechanical resonators are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference.

SUMMARY OF THE INVENTION

A microelectromechanical resonator according to embodiments of the invention includes a resonator body anchored to a substrate by at least a pair of tethers that suspend the resonator body opposite an underlying opening in the substrate. A first thermally-actuated tuning beam is provided, which is mechanically coupled to a first portion of the resonator body that is spaced apart from the pair of tethers. The first thermally-actuated tuning beam is configured to induce a mechanical stress in the resonator body by establishing a thermal expansion difference between the first thermally-actuated tuning beam and the resonator body in response to a passing of current through the first thermally-actuated tuning beam.

According to further embodiments of the invention, a resonator may include: (i) a piezoelectric layer on the resonator body and the pair of tethers; (ii) first and second top electrodes overlapping a first and a second of the pair of tethers, respectively; and (iii) a bottom electrode extending between the piezoelectric layer and the resonator body. According to some of these embodiments of the invention, a point of mechanical coupling between the first thermally-actuated tuning beam and the resonator body may be devoid of an electrode thereon that is coplanar with the first and second top electrodes. However, according to alternative embodiments of the invention, the tuning beam may include not only a portion of the piezoelectric layer thereon, but also an extension of a top electrode that may operate to increase coupling between the tuning beam and the resonator body.

According to still further embodiments of the invention, the first thermally-actuated tuning beam, which may be formed from single crystal silicon, may be electrically isolated from the bottom electrode. The resonator may also include a second thermally-actuated tuning beam mechanically coupled to a second portion of the resonator body that is spaced apart from the pair of tethers. This second thermally-actuated tuning beam is configured to induce a mechanical stress in the resonator body by establishing a thermal expansion difference between the second thermally-actuated tuning beam and the resonator body in response to a passing of current through the second thermally-actuated tuning beam.

According to still further embodiments of the invention, the first thermally-actuated tuning beam is mechanically coupled at about a mid-point thereof to the first portion of the resonator body. The resonator may further include first and second tuning terminals electrically coupled to first and second ends of the first thermally-actuated tuning beam, respectively. Moreover, the first thermally-actuated tuning beam may be configured to support a current therein in response to application of a voltage across the first and second tuning terminals.

According to further embodiments of the invention, a thin-film piezoelectric-on-semiconductor resonator includes a resonator body, which is anchored to a substrate by at least a pair of tethers, and a first U-shaped tuning beam. This beam, which is mechanically coupled to a first portion of the resonator body, is configured to induce a mechanical stress in the resonator body when the first U-shaped tuning beam is heated by a first current passing from a first end of the first U-shaped beam to a second end of the first U-shaped beam. A second U-shaped tuning beam, which is mechanically coupled to a second portion of the resonator body, may also be provided. This second U-shaped tuning beam may be configured to induce a mechanical stress in the resonator body when the second U-shaped tuning beam is heated by a second current passing from a first end of the second U-shaped beam to a second end of the second U-shaped beam. According to further aspects of these embodiments of the invention, a piezoelectric layer may be provided on the resonator body, the pair of tethers and the first U-shaped tuning beam. First and second top electrodes may be provided, which overlap a first and a second of the pair of tethers, respectively. A bottom electrode may be provided, which extends between the piezoelectric layer and the resonator body. The first U-shaped tuning beam may be electrically isolated from the bottom electrode.

According to still further embodiments of the invention, a microelectromechanical resonator includes a resonator body, which is anchored to a substrate by at least a pair of tethers, and a first tuning beam. The first tuning beam is mechanically coupled to a first portion of the resonator body that is spaced apart from the pair of tethers. This first tuning beam is configured to induce a mechanical stress in the resonator body when the first tuning beam is heated by passing a first current therethrough. This resonator may also include a piezoelectric layer on the resonator body and on the pair of tethers. First and second top electrodes may be provided, which overlap with a first and a second of the pair of tethers, respectively. A bottom electrode is provided, which extends between the piezoelectric layer and the resonator body. This bottom electrode may be electrically isolated from the first tuning beam. In particular, the first and second top electrodes may be patterned so that no portions of the first and second top electrodes overlap the first tuning beam. A second tuning beam may also be provided, which is mechanically coupled to a second portion of the resonator body that is diametrically opposite the first portion of the resonator body. The second tuning beam is configured to induce a mechanical stress in the resonator body when the second tuning beam is heated by a second current passing therethrough.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
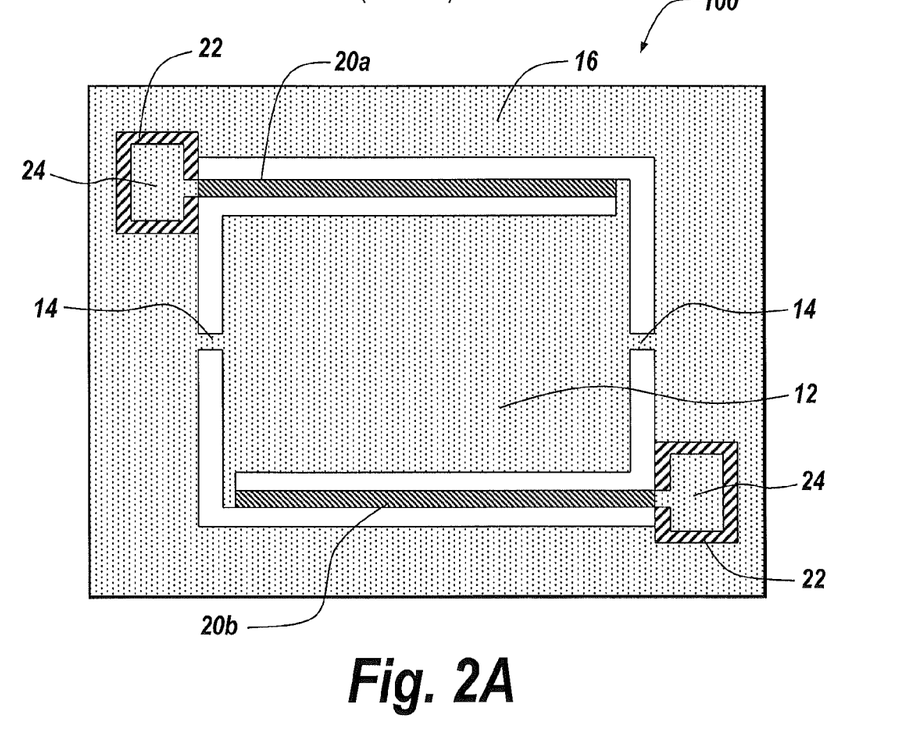
FIG. 2A is a plan view of a semiconductor resonator body of a microelectromechanical resonator with frequency tuning beams, according to an embodiment of the invention.

FIG. 2A illustrates a plan view of a semiconductor resonator body 12 of a microelectromechanical resonator 100 with frequency tuning beams 20a, 20b, according to an embodiment of the invention. The resonator body 12 is anchored to a surrounding substrate 16 by at least a pair of tethers 14 that suspend the resonator body 12 opposite an underlying opening in the substrate 16. First and second thermally-actuated frequency tuning beams 20a, 20b are provided, which may be coplanar with the resonator body 12. The first tuning beam 20a is mechanically coupled to a first portion of the resonator body 12, at a location that is spaced apart from the pair of tethers 14. The second tuning beam 20b is mechanically coupled to a second portion of the resonator body 12, that is diametrically opposite the first portion of the resonator body 12 and spaced apart from the pair of tethers 14. The first and second thermally-actuated tuning beams 20a, 20b are configured to induce a mechanical stress in the resonator body 12 by establishing a thermal expansion difference between each of the first and second thermally-actuated tuning beams 20a, 20b and the resonator body 12 when a heat producing current is passed in series through the first thermally-actuated tuning beam 20a, the resonator body 12 and the second thermally-actuated tuning beam 20b. This series current may be established by biasing the diametrically opposite substrate contact points 24, which are surrounding by electrically insulating regions 22, at sufficiently different voltages to establish a current that passes from one tuning beam 20a to the other tuning beam 20b (or vice versa) via the resonator body 12, which should be of sufficiently low resistance to support a spreading current therein when relatively small voltages are applied to the contact points 24.

Figure 2B:
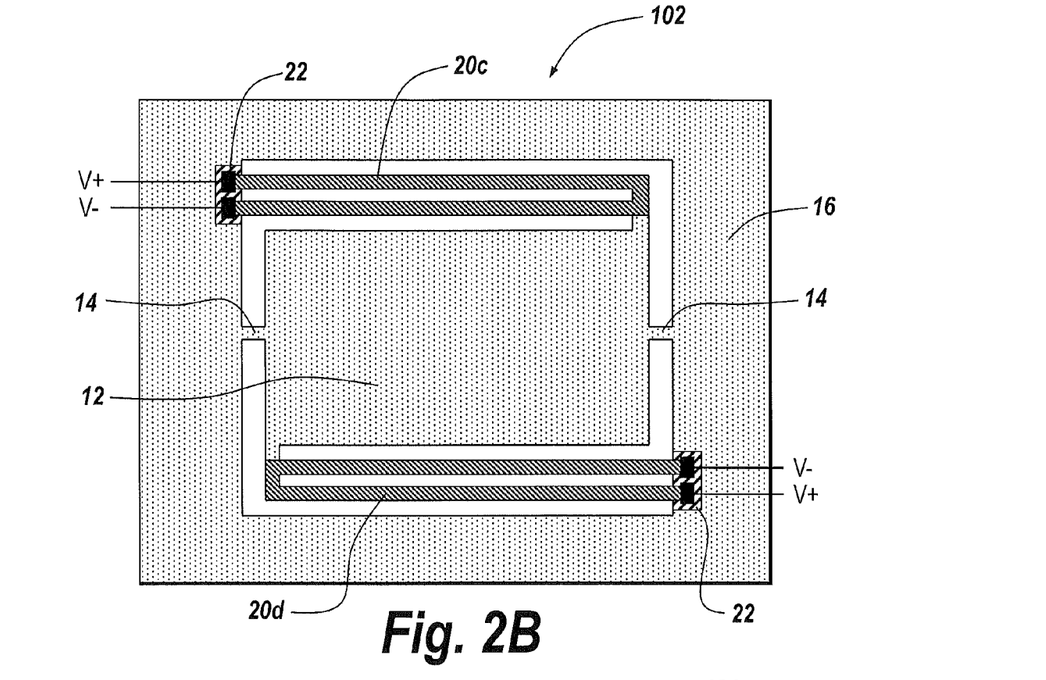
FIG. 2B is a plan view of a semiconductor resonator body of a microelectromechanical resonator with frequency tuning beams, according to an embodiment of the invention.

FIG. 2B illustrates a plan view of another semiconductor resonator body 12 of a microelectromechanical resonator 102 with independently controllable frequency tuning beams 20c, 20d, according to an embodiment of the invention. The resonator body 12 is anchored to a surrounding substrate 16 by at least a pair of tethers 14 that suspend the resonator body 12 opposite an underlying opening in the substrate 16. First and second thermally-actuated U-shaped tuning beams 20c, 20d are provided, which may be coplanar with the resonator body 12. The first tuning beam 20c is mechanically coupled to a first portion of the resonator body 12, at a location that is spaced apart from the pair of tethers 14. The second tuning beam 20d is mechanically coupled to a second portion of the resonator body 12, that is diametrically opposite the first portion of the resonator body 12 and spaced apart from the pair of tethers 14. The first and second thermally-actuated tuning beams 20c, 20d are configured to induce a mechanical stress in the resonator body 12 by establishing a thermal expansion difference between each of the first and second thermally-actuated tuning beams 20c, 20d and the resonator body 12. Each of the first and second tuning beams 20c, 20d may be independently controlled to establish respective thermal expansion differences with the resonator body 12. For example, a pair of contact pads (e.g., metal pads) associated with the first tuning beam 20c may receive unequal voltages V+, V− that establish a first "loop" current therein. This first current may pass down each leg of the U-shaped (i.e., dual) beam 20c in opposite directions and cause resistive heating therein relative to the resonator body 12. Similarly, a pair of contact pads (e.g., metal pads) associated with the second tuning beam 20d may receive unequal voltages V+, V− that establish a second "loop" current therein. This second current may pass down each leg of the U-shaped (i.e., dual) beam 20d in opposite directions and cause resistive heating therein relative to the resonator body 12.

Figure 2C:
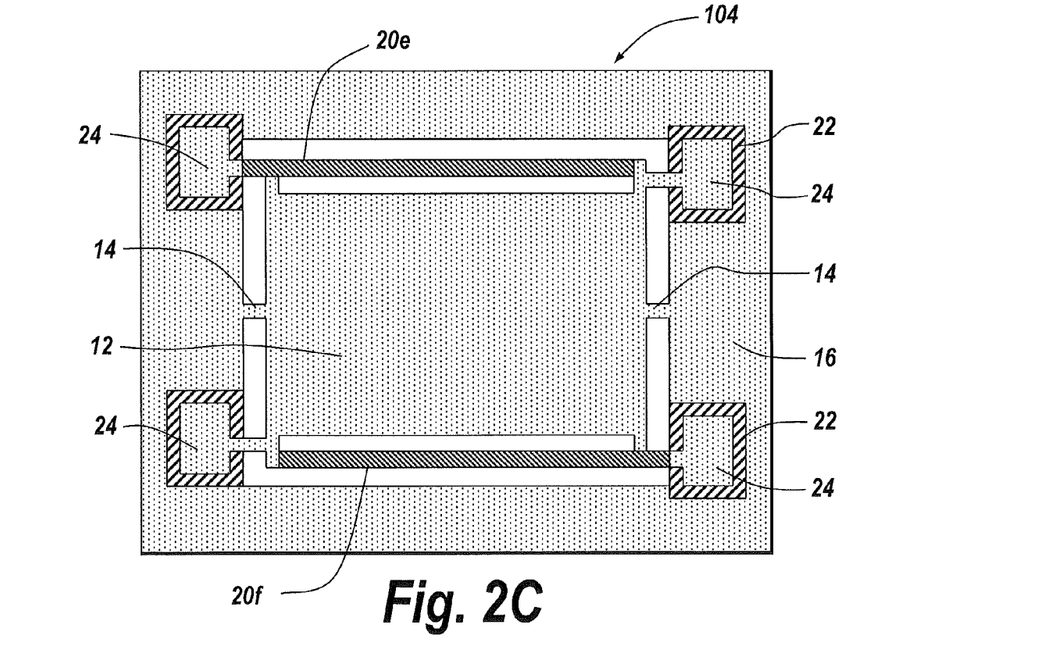
FIG. 2C is a plan view of a semiconductor resonator body of a microelectromechanical resonator with frequency tuning beams, according to an embodiment of the invention.

FIG. 2C illustrates a plan view of a semiconductor resonator body 12 of a microelectromechanical resonator 104 with frequency tuning beams 20e, 20f, according to an embodiment of the invention. The resonator body 12 is anchored to a surrounding substrate 16 by at least a pair of tethers 14 that suspend the resonator body 12 opposite an underlying opening in the substrate 16. First and second thermally-actuated frequency tuning beams 20e, 20f are provided, which may be coplanar with the resonator body 12. The first tuning beam 20e is mechanically coupled to first and second portions of the resonator body 12, at locations that are spaced apart from the pair of tethers 14. The second tuning beam 20f is mechanically coupled to third and fourth portions of the resonator body 12, that are on opposite sides of the resonator body 12 relative to the first and second portions. The first and second thermally-actuated tuning beams 20e, 20f are configured to induce a mechanical stress in the resonator body 12 by establishing a thermal expansion difference between each of the first and second thermally-actuated tuning beams 20e, 20f and the resonator body 12 when heat producing currents are independently established in the first and second tuning beam 20e, 20f. Each of the heat producing currents may be established in respective tuning beams 20e, 20f by applying a voltage across opposing contact points 24 within the substrate 16.

Figure 2D:
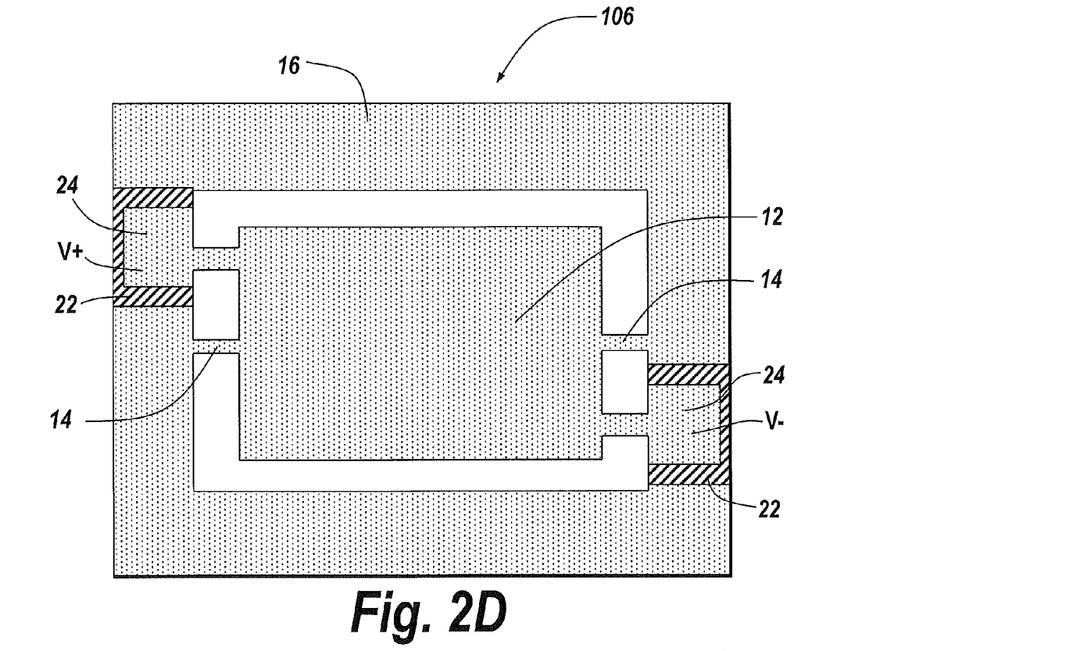
FIG. 2D is a plan view of a semiconductor resonator body of a microelectromechanical resonator with frequency tuning beams, according to an embodiment of the invention.

FIG. 2D illustrates a plan view of a semiconductor resonator body 12 of a microelectromechanical resonator 106 with frequency tuning beam segments located adjacent diametrically opposite corners of the resonator body 12. The resonator body 12 is anchored to a surrounding substrate 16 by at least a pair of tethers 14 that suspend the resonator body 12 opposite an underlying opening in the substrate 16. A first tuning beam segment is mechanically coupled to a first corner of the resonator body 12 and a second tuning beam segment is mechanically coupled to a second corner of the resonator body. The first and second beam segments are configured to induce a mechanical stress in the resonator body 12 by establishing a thermal expansion difference between each beam segment and the resonator body 12 when a heat producing current is passed through the first beam segment, the resonator body 12 and the second beam segment. This current may be established by biasing the diametrically opposite substrate contact points 24, which are surrounding by electrically insulating regions 22, at sufficiently different voltages to establish a current that passes diagonally across the resonator body 12, which should be of sufficiently low resistance to support a spreading current therein when relatively small voltages are applied to the contact points 24. According to additional embodiments of the invention, the contact points between the tuning beams (or beam segments) and the resonator body that are illustrated herein may be positioned at other locations to further reduce any adverse impact on resonator performance, such as resonator Q and insertion loss.

Figure 3A:
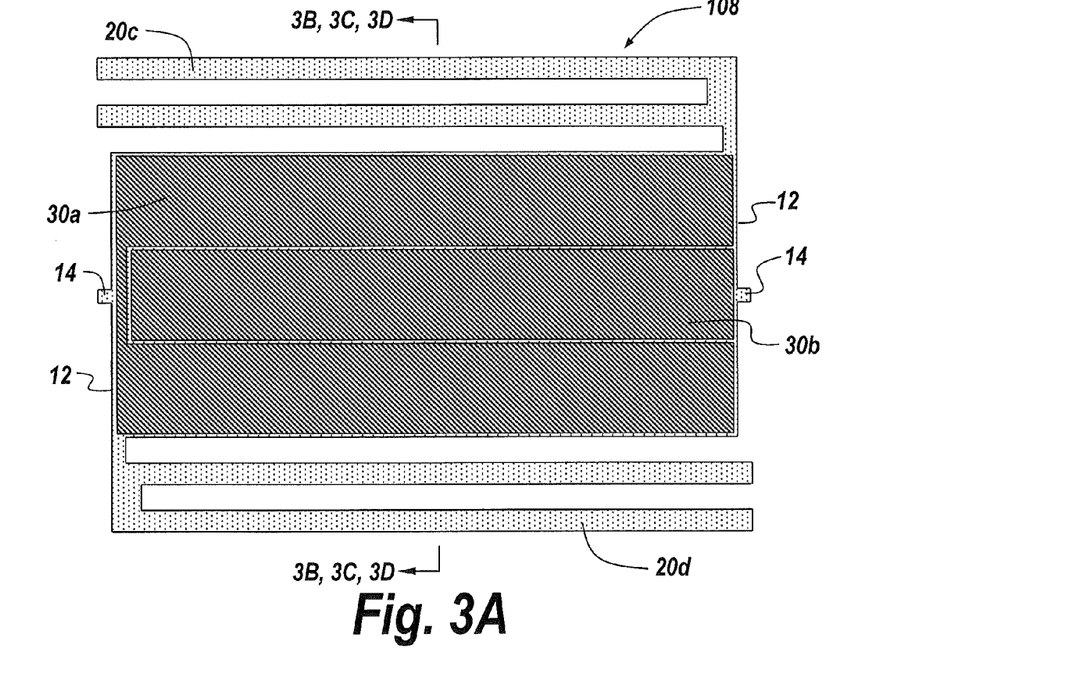
FIG. 3A is a plan view of a microelectromechanical resonator containing a pair of dual-beam structures that support frequency tuning, according to an embodiment of the invention.
Figure 3B:
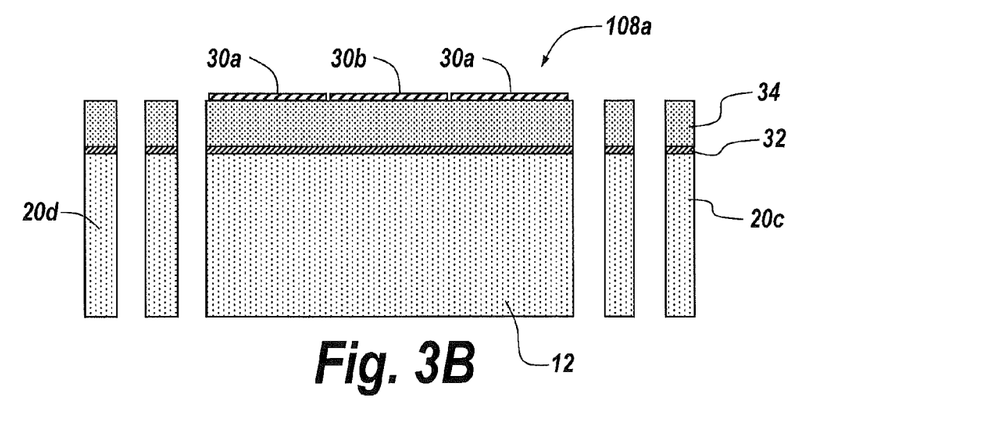
FIG. 3B is a cross-sectional view of one embodiment of the microelectromechanical resonator of FIG. 3A, taken along line 3B-3B.
Figure 3C:
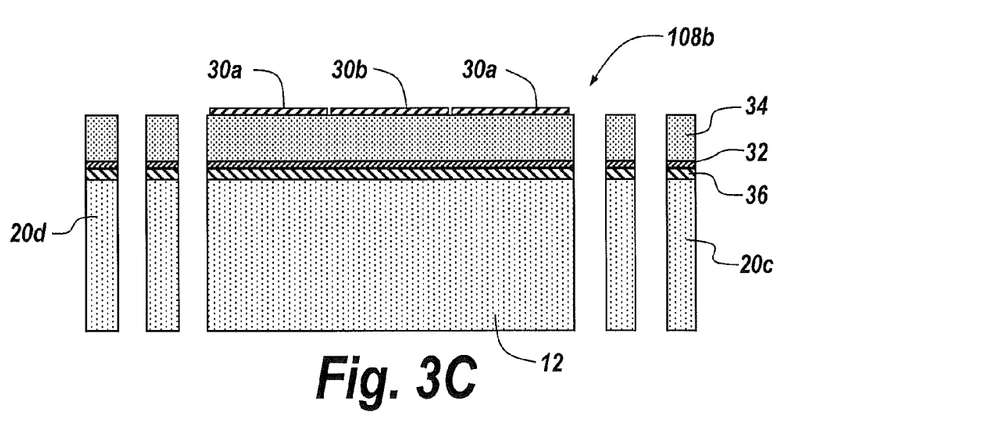
FIG. 3C is a cross-sectional view of one embodiment of the microelectromechanical resonator of FIG. 3A, taken along line 3C-3C.
Figure 3D:
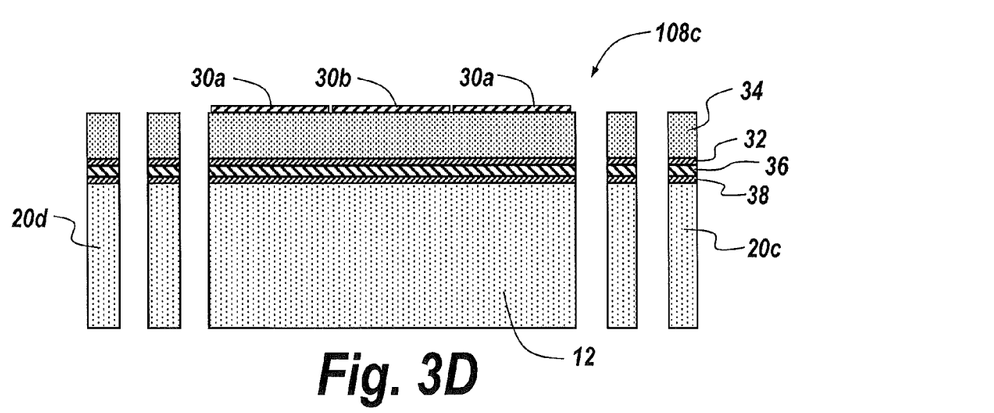
FIG. 3D is a cross-sectional view of one embodiment of the microelectromechanical resonator of FIG. 3A, taken along line 3D-3D.

Referring now to FIG. 3A, a microelectromechanical resonator 108 containing a pair of dual-beam structures (e.g., U-shaped beams) that support frequency tuning will be described. In this resonator 108, the dual-beam structures are similar to those illustrated by FIG. 2B. In particular, the resonator 108 includes a resonator body 12 (e.g., monocrystalline silicon body) anchored to a surrounding substrate (see, e.g., substrate 16 in FIG. 2B) by at least a pair of tethers 14 that suspend the resonator body 12 opposite an underlying opening in the substrate. A first thermally-actuated tuning beam 20c is mechanically coupled to a first portion of the resonator body 12, which is spaced apart from the pair of tethers 14. This first thermally-actuated tuning beam 20c is configured to induce a mechanical stress in the resonator body 12 by establishing a thermal expansion difference and thermal gradient between the first thermally-actuated tuning beam 20c and the resonator body 12 in response to a passing of current through the first thermally-actuated tuning beam 20c. As illustrated by FIGS. 3B-3D, resonator embodiments 108a-c further includes a piezoelectric layer 34 on the resonator body 12 and the pair of tethers 14 and first and second top electrodes 30a, 20b overlapping a first and a second of the pair of tethers 14, respectively. A bottom reference electrode 32 (e.g., molybdenum electrode) is also provided, which extends between the piezoelectric layer 34 and the underlying resonator body 12. As illustrated by FIG. 3A, the point of mechanical coupling/contact between the first thermally-actuated tuning beam 20c and the resonator body 12 may be devoid of an electrode thereon that is coplanar with said first and second top electrodes 30a, 30b, but may include a portion of the piezoelectric layer 34 thereon, as shown by FIGS. 3B-3D. Alternatively, an extension of a top electrode may be provided on a tuning beam.

According to an additional embodiment of the invention illustrated by FIG. 3C, the first thermally-actuated tuning beam 20c may be electrically isolated from the bottom electrode 32 by an electrically insulating layer 36 (e.g., oxide layer), which extends between the bottom electrode 32 and the tuning beam 20c. Moreover, as illustrated by FIG. 3D, a tuning beam electrode 38 may be provided between the tuning beams 20c, 20d and the insulating layer 36 in the event the beams 20c, 20d have a relatively large resistance. The use of a separate tuning beam electrode (or bottom resonator electrode) to conduct tuning beam current may be used in other embodiments described herein in the event a resonator body (or tuning beam) is not of sufficient low resistance to conduct tuning beam current at relatively low applied tuning voltages.

FIGS. 3A-3D further illustrate a second thermally-actuated tuning beam 20d that is mechanically coupled to a second portion of the resonator body 12 that is spaced apart from the pair of tethers 14. The second thermally-actuated tuning beam 20d is configured to induce a mechanical stress in the resonator body 12 by establishing a thermal expansion difference between the second thermally-actuated tuning beam 20d and the resonator body 12 in response to a passing of current through the second thermally-actuated tuning beam 20d. The thermally-actuated tuning beam 20d is mechanically coupled at about a mid-point thereof to the second portion of the resonator body 12. Moreover, as illustrated by FIGS. 2B and 3A, first and second tuning terminals, which receive unequal voltages (V+, V−), are provided to induce independently controllable loop currents in the tuning beams 20c, 20d in the event the resistance of the beams is sufficiently low. Alternatively, as illustrated by FIG. 3D, the loop currents may be provided in the tuning beam electrode 38 in order to provide resistive heating to the beams 20c, 20d.

Figure 4A:
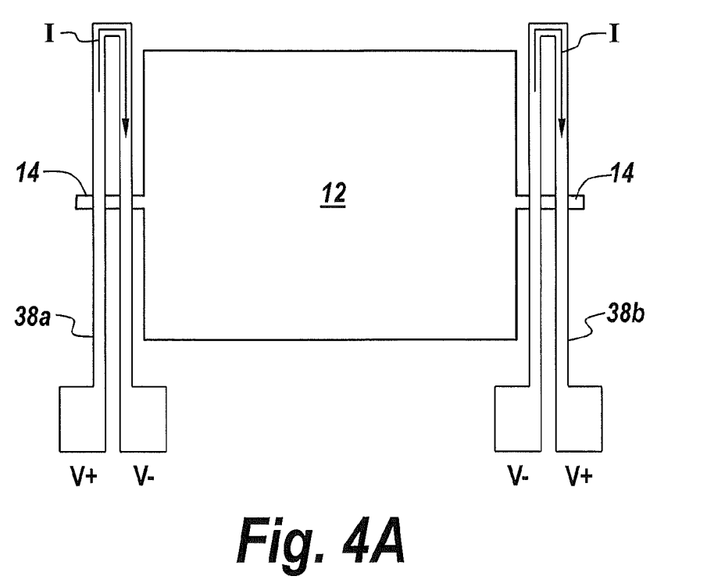
FIG. 4A is a plan view of a semiconductor resonator body of a microelectromechanical resonator with frequency tuning beams, according to an embodiment of the invention.
Figure 4B:
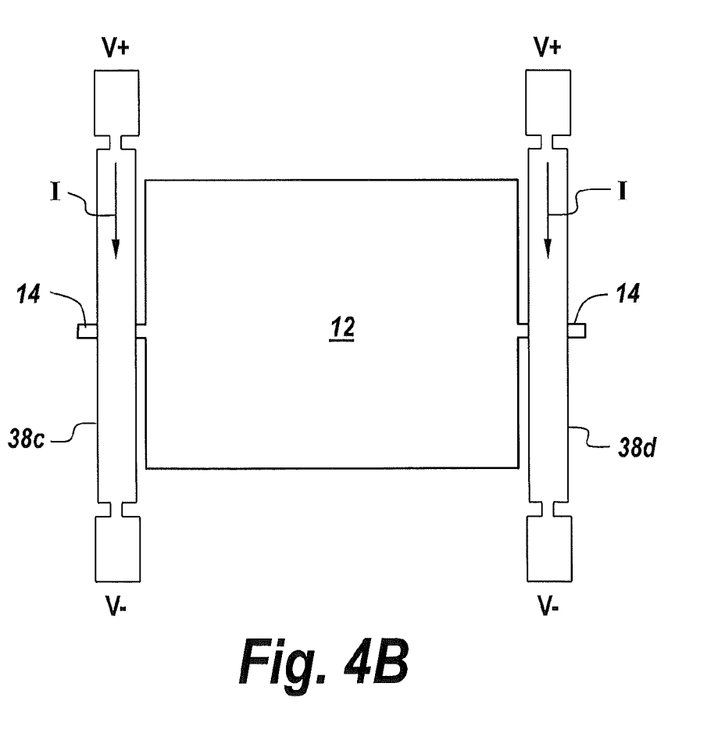
FIG. 4B is a plan view of a semiconductor resonator body of a microelectromechanical resonator with frequency tuning beams, according to an embodiment of the invention.

According to still further embodiments of the invention illustrated by FIGS. 4A-4B, a semiconductor resonator body 12 of a microelectromechanical resonator may be provided with U-shaped frequency tuning beams 38a, 38b (in FIG. 4A) or straight tuning beams 38c, 38d (in FIG. 4B), which are mechanically coupled directly to the support tethers 14, but do not pass current through the resonator body 12. These microelectromechanical resonators may include a resonator body 12 anchored to a surrounding substrate by at least a pair of tethers 14 that suspend the resonator body 12 opposite an underlying opening in the substrate. As shown by FIG. 4A, a pair of thermally-actuated and U-shaped tuning beams 38a, 38b are mechanically coupled to respective tethers 14. And in FIG. 4B, a pair of stripe-shaped tuning beams 38c, 38d are mechanically coupled to respective tethers 14. Each of the tuning beams 38a, 38b in FIG. 4A (and tuning beams 38c, 38d in FIG. 4B) is configured to induce a mechanical stress in a corresponding tether 14 by establishing a thermal expansion difference between the tuning beam and the tether in response to a passing of current through tuning beam. This current can be established by biasing the ends of the tuning beams 38a, 28b (or 38c, 38d) with respective voltages (V+, V−). According to some embodiments of the invention, each of the tuning beams 38a, 38b (or 38c, 38d) may include a patterned semiconductor layer, which is coplanar with the resonator body 12 and the tethers 14. In addition, to maintain a sufficiently high electrical conductivity of the tuning beams, a patterned layer of metallization may be provided on an upper surface of the underlying patterned semiconductor layer. This patterned layer of metallization may be formed by depositing a blanket layer of metallization on a semiconductor device layer of a semiconductor-on-insulator substrate and then patterning the deposited metal layer in advance of depositing a composite of an electrically insulating layer, a bottom electrode metal layer, a piezoelectric layer and an upper electrode metal layer on the substrate. According to still further embodiments of the invention, each of the U-shaped tuning beams 38a, 38b highlighted by FIG. 4A may terminate at the support tethers 14, which means that portions of the support tethers may pass all of the tuning current from one leg of a tuning beam to the other leg during the resistive heating of the tuning beams 38a, 38b.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:
1. A microelectromechanical resonator, comprising:
a resonator body anchored to a substrate by at least a pair of tethers that suspend said resonator body opposite an underlying opening in the substrate; and
a first thermally-actuated tuning beam mechanically coupled to a first portion of said resonator body that is spaced apart from the pair of tethers, said first thermally-actuated tuning beam configured to induce a mechanical stress in said resonator body by establishing a thermal expansion difference between said first thermally-actuated tuning beam and said resonator body in response to a passing of current through said first thermally-actuated tuning beam.

2. The resonator of claim 1, further comprising:
a piezoelectric layer on said resonator body and the pair of tethers;
first and second top electrodes overlapping a first and a second of the pair of tethers, respectively; and
a bottom electrode extending between said piezoelectric layer and said resonator body.

3. The resonator of claim 2, wherein a point of mechanical coupling between said first thermally-actuated tuning beam and said resonator body is devoid of an electrode thereon that is coplanar with said first and second top electrodes.

4. The resonator of claim 2, wherein a point of mechanical coupling between said first thermally-actuated tuning beam and said resonator body comprises a portion of said piezoelectric layer thereon.

5. The resonator of claim 2, wherein said first thermally-actuated tuning beam is electrically isolated from said bottom electrode.

6. The resonator of claim 1, wherein said first thermally-actuated tuning beam comprises single crystal silicon.

7. The resonator of claim 1, further comprising:
a second thermally-actuated tuning beam mechanically coupled to a second portion of said resonator body that is spaced apart from the pair of tethers, said second thermally-actuated tuning beam configured to induce a mechanical stress in said resonator body by establishing a thermal expansion difference between said second thermally-actuated tuning beam and said resonator body in response to a passing of current through said second thermally-actuated tuning beam.

8. The resonator of claim 1, wherein said first thermally-actuated tuning beam is mechanically coupled at about a mid-point thereof to the second portion of said resonator body.

9. The resonator of claim 8, further comprising first and second tuning terminals electrically coupled to first and second ends of said first thermally-actuated tuning beam, respectively; and wherein said first thermally-actuated tuning beam is further configured to support a current therein in response to application of a voltage across the first and second tuning terminals.

10. The resonator of claim 9, further comprising:
a second thermally-actuated tuning beam mechanically coupled to a second portion of said resonator body that is spaced apart from the pair of tethers, said second thermally-actuated tuning beam configured to induce a mechanical stress in said resonator body by establishing a thermal gradient across a point of mechanical coupling between said second thermally-actuated tuning beam and said resonator body in response to a passing of current through said second thermally-actuated tuning beam; and
a pair of tuning terminals electrically coupled to opposing ends of said second thermally-actuated tuning beam.

11. The resonator of claim 10, wherein said second thermally-actuated tuning beam is mechanically coupled at about a mid-point thereof to the second portion of said resonator body.

12. A thin-film piezoelectric-on-semiconductor resonator, comprising:
a resonator body anchored to a substrate by at least a pair of tethers; and
a first U-shaped tuning beam mechanically coupled to a first portion of said resonator body, said first U-shaped tuning beam configured to induce a mechanical stress in said resonator body when said first U-shaped tuning beam is heated by a first current passing from a first end of the first U-shaped beam to a second end of the first U-shaped beam.

13. The resonator of claim 12, further comprising a second U-shaped tuning beam mechanically coupled to a second portion of said resonator body, said second U-shaped tuning beam configured to induce a mechanical stress in said resonator body when said second U-shaped tuning beam is heated by a second current passing from a first end of the second U-shaped beam to a second end of the second U-shaped beam.

14. The resonator of claim 12, further comprising:
a piezoelectric layer on said resonator body, the pair of tethers and said first U-shaped tuning beam;
first and second top electrodes overlapping a first and a second of the pair of tethers, respectively; and
a bottom electrode extending between said piezoelectric layer and said resonator body.

15. The resonator of claim 14, wherein said first U-shaped tuning beam is electrically isolated from said bottom electrode.

16. A microelectromechanical resonator, comprising:
a resonator body anchored to a substrate by at least a pair of tethers; and
a first tuning beam mechanically coupled to a first portion of said resonator body that is spaced apart from the pair of tethers, said first tuning beam configured to induce a mechanical stress in said resonator body when said first tuning beam is heated by a first current passing therethrough.

17. The resonator of claim 16, further comprising:
a piezoelectric layer on said resonator body and the pair of tethers;
first and second top electrodes overlapping a first and a second of the pair of tethers, respectively; and
a bottom electrode extending between said piezoelectric layer and said resonator body.

18. The resonator of claim 17, wherein said first tuning beam is electrically isolated from said bottom electrode.

19. The resonator of claim 17, wherein no portions of said first and second top electrodes overlap said first tuning beam.

20. The resonator of claim 16, further comprising:
a second tuning beam mechanically coupled to a second portion of said resonator body that is diametrically opposite the first portion of said resonator body, said second tuning beam configured to induce a mechanical stress in said resonator body when said second tuning beam is heated by a second current passing therethrough.

21. A microelectromechanical resonator, comprising:
a resonator body anchored to a substrate by at least a pair of tethers that suspend said resonator body opposite an underlying opening in the substrate; and
a first thermally-actuated tuning beam mechanically coupled to a first one of the pair of tethers, said first thermally-actuated tuning beam configured to induce a mechanical stress in the first one of the pair of tethers by establishing a thermal expansion difference between said first thermally-actuated tuning beam and the first one of the pair of tethers in response to a passing of current through said first thermally-actuated tuning beam.

22. The resonator of claim 21, further comprising:

a second thermally-actuated tuning beam mechanically coupled to a second one of the pair of tethers, said second thermally-actuated tuning beam configured to induce a mechanical stress in the second one of the pair of tethers by establishing a thermal expansion difference between said second thermally-actuated tuning beam and the second one of the pair of tethers in response to a passing of current through said second thermally-actuated tuning beam.

\* \* \* \* \*